United States Patent

Hyun et al.

[11] Patent Number: 6,060,704
[45] Date of Patent: May 9, 2000

[54] PHOTODETECTOR FOR SIMULTANEOUS RECOGNITION OF MULTIPLE WAVELENGTHS, AND METHOD THEREFOR

[75] Inventors: Kyung-Sook Hyun; O-Kyun Kwon; Kwang-Joon Kim; El-Hang Lee, all of Daejeon, Rep. of Korea

[73] Assignee: Electronics and Telecommunications Research Institute, Daejeon, Rep. of Korea

[21] Appl. No.: 08/842,870

[22] Filed: Apr. 17, 1997

[30] Foreign Application Priority Data

Dec. 20, 1996 [KR] Rep. of Korea ........................ 96-69283

[51] Int. Cl.$^7$ .................................................. H01L 27/14
[52] U.S. Cl. .......................... 250/214.1; 257/656; 257/14
[58] Field of Search ........................ 250/214.1; 257/656, 257/14, 184, 432, 17

[56] References Cited

U.S. PATENT DOCUMENTS

| | | | |
|---|---|---|---|
| 4,323,911 | 4/1982 | Campbell et al. | 257/189 |
| 4,544,938 | 10/1985 | Scholl | 257/435 |
| 4,935,935 | 6/1990 | Reed et al. | 372/44 |
| 5,144,397 | 9/1992 | Tokuda et al. | 257/656 |
| 5,198,659 | 3/1993 | Smith et al. | 250/214.1 |
| 5,216,237 | 6/1993 | Ritchie et al. | 250/214.1 |
| 5,329,136 | 7/1994 | Goossen | 257/17 |

OTHER PUBLICATIONS

Goossen, K.W., et al. Voltage–tunable multiple quantum well photodetector vertically integrated with voltage–tunable multiple quantum well filter, Appl. Phys. Lett, vol. 62, No. 25, pp. 3229–3231, Jun. 21, 1993.

Soole, J.B.D., et al. Polarisation–independent monolithic eight–channel 2 nm spacing WDM detector based on compact arrayed waveguide demultiplexer, Electronics Letters, vol. 31, pp. 1289–1291, Jul. 20, 1995.

Alferness, R.C., et al. Tunable optical waveguide directional coupler filter, Appl. Phys. Lett., vol. 33, No. 2, pp. 161–163, Jul. 15, 1978.

Nabiev, R.F., et al. Spectrodetector: novel monolithic wavelength reader and photodetector, Electronics Letters, vol. 31, No. 16, pp. 1373–1374, Aug. 3, 1995.

Primary Examiner—Edward P. Westin
Assistant Examiner—Thanh X. Luu
Attorney, Agent, or Firm—Cohen, Pontani, Lieberman & Pavane

[57] ABSTRACT

For a multiple transmission communication system, how to individually isolate the transmitted lights and then to distribute to the terminals has been primary concerns to be solved. In the photodetector structure, an absorption layer may be configured as either multiple quantum well structures corresponding to operational wavelengths, or filter-based structure, allowing to select wavelengths in a 1:2:4:8 ratio as an absorptance for each wavelength. In case of using such four-fold lights, the determination as to which wavelength among four-fold wavelengths can be made based upon the total amounts of the current flow in such a photodetector. The photodetector employing such schemes is provided from the present invention.

1 Claim, 4 Drawing Sheets

PHOTODETECTOR FOR SIMULTANEOUS RECOGNITION OF MULTIPLE WAVELENGTHS, AND METHOD THEREFOR

BACKGROUND OF THE INVENTION

1. Field of the Invention

The present invention relates to a photodetector for simultaneous recognition of multiple wavelengths, and a method therefor, by which when lights of various wavelengths are transmitted through a single filter, those transmitted lights can be recognized at the same time, and then be processed.

2. Description of the Conventional Art

To meet the continuously increased demands for exchanging the required information, the information processing speed in the light transmission fields has been continuously improved. To this end, there is currently provided a scheme of WDM(wavelength division multiplexing) under development in which the transmission amount per unit time is further increased through simultaneous transmission of various wavelengths. Thus, what is needed is to develop wavelength variable light source suitable for WDM method, multiple-wavelength light source, wavelength variable-type photodetector, photodetector for simultaneous detection, etc.

For the wavelength division multiplexing method, since the lights including various wavelengths are transmitted through a single fiber, it is required to individually extract each information embedded in the transmitted lights. A conventional method for detecting the multiple lights employs gratings, each being provided with each detector, so as to individually isolate each wavelength, but requires the sophisticated works and loss of cost in manufacturing the gratings, furthermore resulting in the complicated detector configuration.

Further, there may be employed another method in which the fibers inscribed with grating therein are used, as much as the number of wavelengths, so as to extract each light corresponding to each wavelength, but results in an inconvenience and loss, similarly.

Still further, a semiconductor-based filter may be used for applications as mentioned above. This approach using the filter equally divides the transmitted lights, and then selects only one wavelength as desired. However, this approach has a problem in that a considerable loss of the incident light at a boundary between the light fiber and the light element occurs, and the light receiving parts are very complicated.

As mentioned above, through any one among the conventional methods may be extracted one wavelength of multiple wavelengths and then processed, but in which those methods have disadvantages of a weaken intensity of the light which is transmitted, a complicated detector, and difficulty in manufacturing the device.

SUMMARY OF THE INVENTION

Accordingly, it is an object of the present invention to provide a photodetector that enables to simultaneously detect lights of multiple wavelengths, and a method therefor.

To achieve the above object, there is provided a pin-typed photodetector having a first semiconductor contact layer doped with a first impurity, a light absorption layer, and a second semiconductor contact layer doped with a second impurity of opposite conductivity type different from that of the first impurity, characterized in that the light absorption layer comprises a semiconductor layer uniformly responsive to wavelengths passed through a filter, and the filter layer is formed over the first contact layer and has different transit for each multiple wavelength used.

Further, according to another aspect of the present invention, there is provided a method for selecting wavelengths in a 1:2:4:8 ratio as an absorptance for the wavelengths and for simultaneously detecting light of four-fold wavelengths, based upon a pin-typed photodetector configured to comprise a first semiconductor contact layer doped with a first impurity, a light absorption layer including undoped semiconductor layer having multiple quantum wells corresponding to operational wavelengths, and a second semiconductor contact layer doped with a second impurity of opposite conductivity type different from that of the first impurity.

BRIEF DESCRIPTION OF THE DRAWINGS

The present invention will become more fully understood to following detailed description taken in conjunction with the accompanying drawings, wherein.

DETAILED DESCRIPTION OF THE INVENTION

The preferred embodiment according to the present invention will now be described in detail in accordance with the accompanying drawings.

Figure 1A:
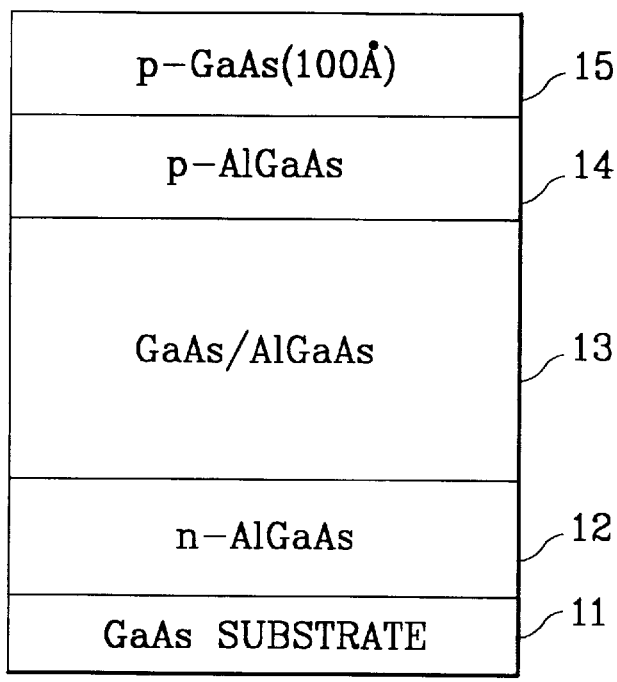
FIG. 1A shows a physical structure of a photodetector in accordance with one embodiment of the present invention.

FIG. 1A shows a physical structure of a photodetector in accordance with one embodiment of the present invention, where on GaAs substrate 11 is formed n-type doped n-AlGaAs contact layer 12, followed by a layer of GaAs/AlGaAs as undoped absorption layer 13 which consists of multiple quantum wells corresponding to operational wavelengths. On the absorption layer 13 is formed p-type doped p-AlGaAs contact layer 14, followed by p-GaAs layer 15 thereon so as to provide the improved contact between p-AlGaAs contact layer 14 and metals. For the resulting structure, a metallic electrode layer for ohmic contact to p-type is connected to p-GaAs layer 15, while another metallic electrode layer for ohmic contact to n-type is formed on n-AlGaAs contact layer 12.

Figure 1B:
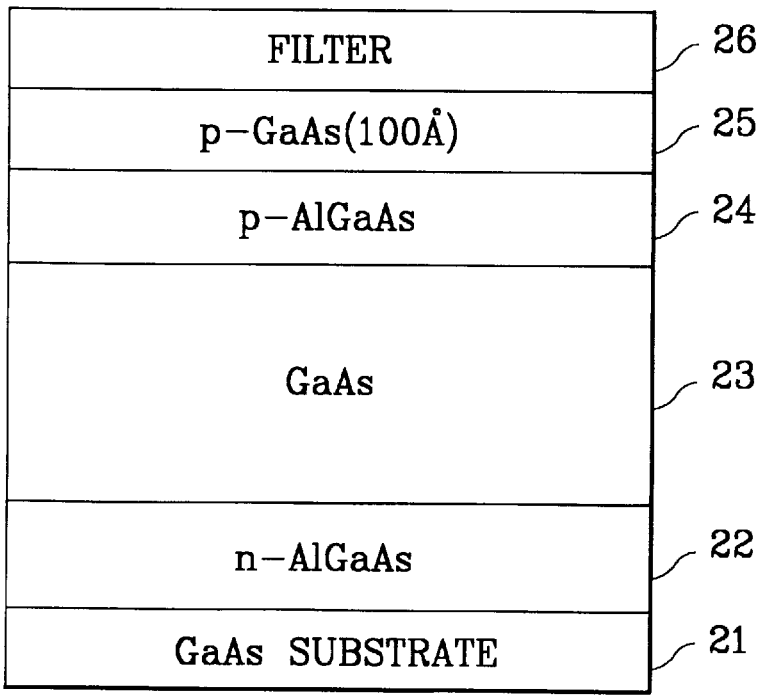
FIG. 1B shows a physical structure of a photodetector in accordance with another embodiment of the present invention.

FIG. 1B shows a physical structure of a photodetector in accordance with another embodiment of the present invention, where on GaAs substrate 21 is formed n-type doped n-AlGaAs contact layer 22, followed by a layer of GaAs, as undoped absorption layer 23, made of materials uniformly responsive to wavelengths passed a filter. On the absorption layer 23 is formed p-type doped p-AlGaAs contact layer 24, followed by p-GaAs layer 25 thereon so as to provide the improved contact between the p-AlGaAs contact layer 24 and a subsequently formed wavelength filtering layer 26. The filter layer 26 on the P-GaAs layer 25 may be implemented in either a semiconductor mirror construction or a dielectric material, where the filtering implies that the layer 26 has different transit for each multiple wavelength.

As stated earlier, the present invention provides a photodetector for simultaneous processing of multiple wavelengths of a pin structure employing a combination of filter and semiconductor as an absorption layer(see FIG. 1B), such that by using the filter having different absorptance for each wavelength, different levels of the current amount can be derived by which the photodetector is characterized. Another pin structure device is also provided in which a semiconductor as a light absorption layer takes multiple quantum well structure for providing different absorptance for each wavelength(see FIG. 1A).

In operation thereof, as in the conventional pin structured device, the electric current flows when an electric field is applied to the intrinsic region and a light having the operational wavelengths is incident upon the device. At this time, the current flow linearly increases and decreases within a predetermined intensity range of the incident light, thus allowing the detection of multiple wavelengths. Therefore, the current amount varied with the intensity of the light can be digitalized for simultaneous recognition of multiple wavelengths.

Figure 2A:
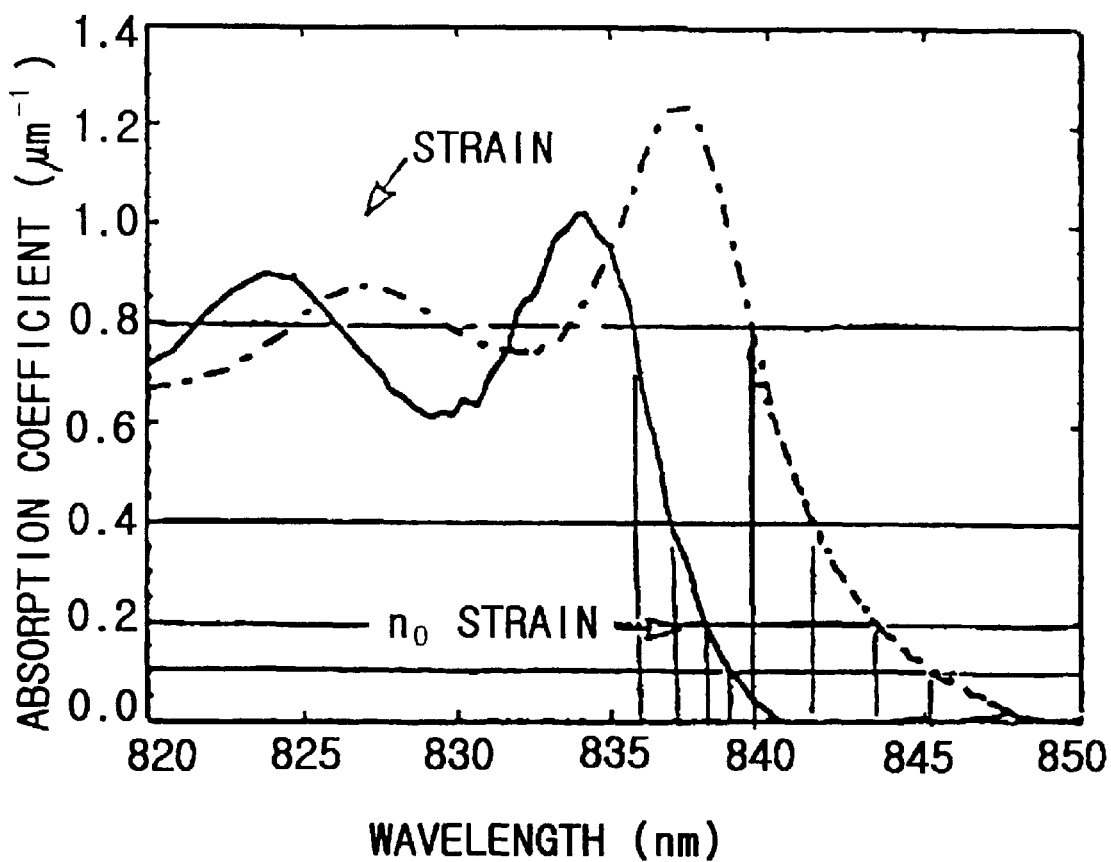
FIG. 2A graphically shows the absorption coefficient spectrums versus wavelengths for the device having GaAs/AlGaAs layer of multiple quantum well structure, in case a strain is applied and no strain applied to the device, respectively.

For the light detector, the absorption layer of multiple quantum well structure allows a specific wavelength to be selected, using different absorptances for wavelengths. FIG. 2A graphically shows the absorption coefficient spectrums versus wavelengths for the device having GaAs/AlGaAs layer of multiple quantum well structure, in case a strain is applied and no strain applied to the device, respectively. As shown in drawing, wavelength can be selected which has an absorptance in the ratio of 1:2:4:8.

Figure 2B:
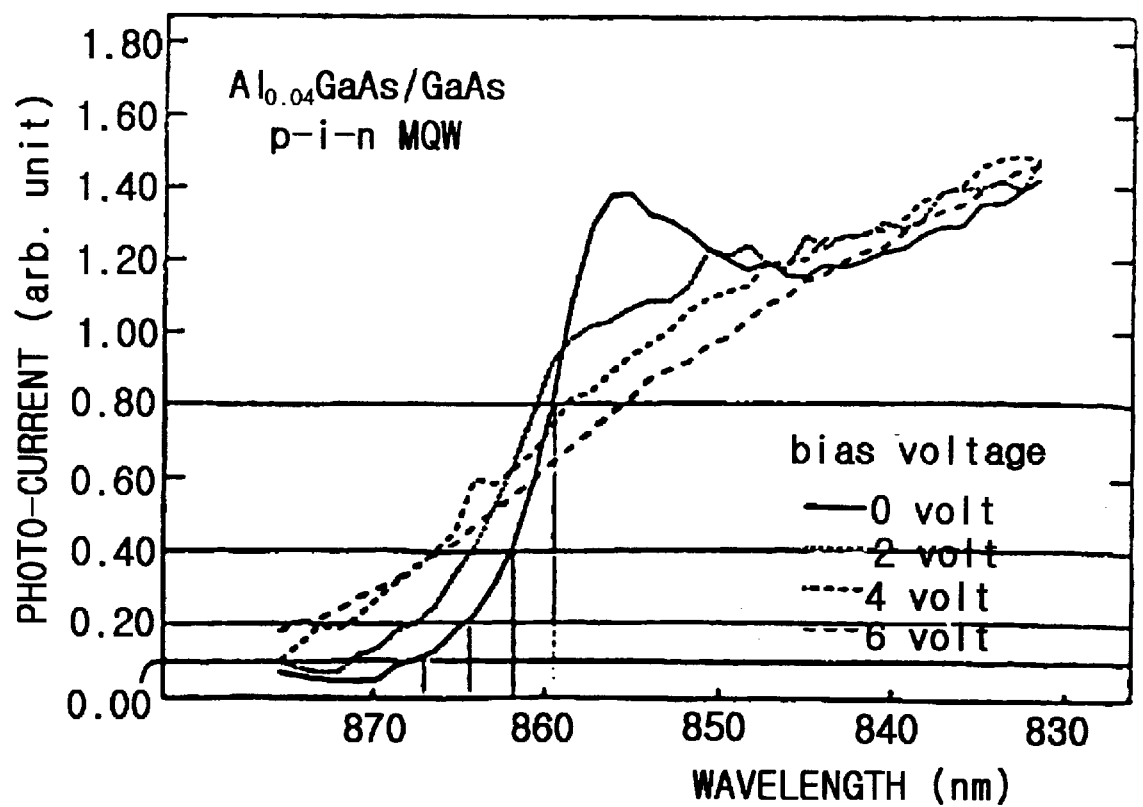
FIG. 2B shows a light current characteristics spectrum for GaAs/AlGaAs of multiple quantum well structure.

FIG. 2B shows a photocurrent characteristics spectrum for GaAs/AlGaAs of multiple quantum well structure, in which usable wavelengths are depicted as one example. The usable wavelengths, in case of the strained device, include 859.5, 862, 864.5 and 867 which are spaced an equal interval of about 2.5 nm.

As described above, we know that the absorption layer of multiple quantum well structure allows a specific wavelength to be selected, using different absorptances for wavelengths. Thus, in case of implementing the photodetector for simultaneous recognition for the lights of four-fold wavelengths expected to frequently used in the future, wavelengths are selected which have absorptances in a 1:2:4:8 ratio, and then in this case, the determination as to which wavelength among four-fold wavelengths is made based upon the total amounts of the current flow in such a photodetector.

If the transmitted wavelengths consist of λ1, λ2, λ3 and λ4, the number of possible different combinations associated with digitalized four incident lights is 16, as shown as Table 1 below, and therefore different discrete levels 0 to 15 representing the electric current flow can be taken, to result in individual measurements thereof.

TABLE 1

| wavelength 1 | wavelength 2 | wavelength 3 | wavelength 4 | relative amount of the current | in case of digitalization |
|---|---|---|---|---|---|
| O | O | O | O | 15 | 1111 |
| X | O | O | O | 14 | 1110 |
| O | X | O | O | 13 | 1100 |
| X | X | O | O | 12 | 1011 |
| O | O | X | O | 11 | 1010 |
| X | O | X | O | 10 | 1010 |
| O | X | X | O | 9 | 1001 |
| X | X | X | O | 8 | 1000 |
| O | O | O | X | 7 | 111 |
| X | O | O | X | 6 | 110 |
| O | X | O | X | 5 | 101 |
| X | X | O | X | 4 | 100 |
| O | O | X | X | 3 | 11 |
| X | O | X | X | 2 | 10 |
| O | X | X | X | 1 | 1 |
| X | X | X | X | 0 | 0 |

As seen from Table 1, the digitalized levels of the current allow the same signal as initial incident condition of each wavelength to be recovered.

Figure 3:
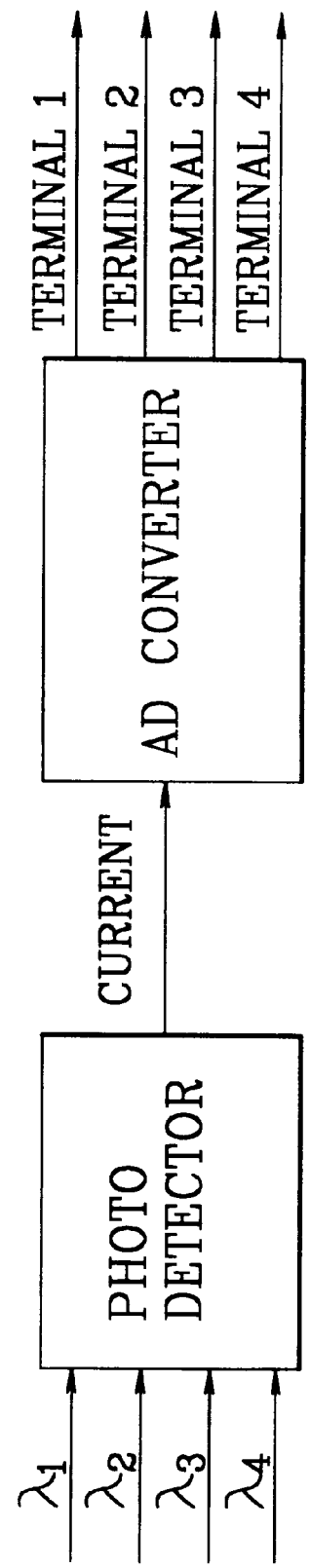
FIG. 3 shows a light detecting system using the photodetector in accordance with the present invention.

FIG. 3 shows a light detecting system using the photodetector construction in accordance with the present invention.

For a multiple transmission communication system, how to individually isolate the transmitted lights and then to distribute to the terminals has been primary concerns to be solved. As disclosed above, simultaneous recognition for four-fold wavelengths or the more through relatively simple structure can replace the conventional light detecting system which filter, grating elements, etc. are integrated therein, and thus is complicated and difficult in manufacturing it.

What is claimed is:

1. A pin-typed photodetector for selecting wavelengths in a 1:2:4:8 ratio as an absorptance for the wavelengths to be used and for simultaneously detecting light of four-fold wavelengths, comprising:

a first semiconductor contact layer doped with a first impurity;

a light absorption layer including undoped semiconductor layer having multiple quantum wells corresponding to operational wavelengths; and a second semiconductor contact layer doped with a second impurity of opposite conductivity type different from the first impurity.

* * * * *